United States Patent
Kim et al.

(10) Patent No.: US 8,445,910 B2
(45) Date of Patent: May 21, 2013

(54) HIGH RESOLUTION ORGANIC LIGHT EMITTING DISPLAY WITH INCREASED APERTURE RATIO

(75) Inventors: Jong-Yun Kim, Yongin (KR); Il-Jeong Lee, Yongin (KR); Choong-Youl Im, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 0 days.

(21) Appl. No.: 13/074,142

(22) Filed: Mar. 29, 2011

(65) Prior Publication Data
US 2011/0291091 A1    Dec. 1, 2011

(30) Foreign Application Priority Data
Jun. 1, 2010    (KR) .................. 10-2010-0051678

(51) Int. Cl.
*H01L 29/04*    (2006.01)
(52) U.S. Cl.
USPC .................. 257/57; 257/E51.019
(58) Field of Classification Search
USPC ............................ 257/57, E51.019
See application file for complete search history.

(56) References Cited

U.S. PATENT DOCUMENTS

| 2006/0255725 | A1 | 11/2006 | Kim |
| 2006/0255726 | A1 | 11/2006 | Kim |
| 2007/0176538 | A1* | 8/2007 | Winters et al. ............ 313/504 |
| 2008/0237585 | A1* | 10/2008 | Kim .............................. 257/40 |
| 2010/0026169 | A1 | 2/2010 | Jeong et al. |
| 2010/0127273 | A1 | 5/2010 | Kim |
| 2010/0140649 | A1 | 6/2010 | Kim et al. |
| 2010/0176383 | A1 | 7/2010 | Park et al. |
| 2010/0176388 | A1 | 7/2010 | Ha et al. |
| 2010/0176394 | A1 | 7/2010 | Park et al. |

FOREIGN PATENT DOCUMENTS

| KR | 10-0658755 | 12/2006 |
| KR | 10-0683679 | 2/2007 |
| KR | 10-2009-0059843 A | 6/2009 |

OTHER PUBLICATIONS

Korean Office action issued by KIPO on Nov. 30, 2011, corresponding to Korean Patent Application No. 10-2010-0051678 and Request for Entry attached herewith.

* cited by examiner

*Primary Examiner* — Kimberly Rizkallah
*Assistant Examiner* — Marvin Payen
(74) *Attorney, Agent, or Firm* — Robert E. Bushnell, Esq.

(57) ABSTRACT

In an organic light emitting display, a conductive layer is formed on the bottom surface of a substrate, and the conductive layer is used as a wiring line for supplying a power source, and as the electrode of a capacitor. Therefore, it is possible to easily secure the aperture ratio of a pixel, to easily solve the problem of IR drops by controlling the area or thickness of the conductive layer, and to easily secure the electrostatic capacity of the capacitor. In particular, in the case of a front surface light emitting structure, since a capacitor of a metal/insulating layer/metal (MIM) structure may be formed in a light emitting region, enough aperture ratio and electrostatic capacity may be secured. Therefore, a high resolution organic light emitting display may be easily realized, and enough aperture ratio and electrostatic capacity are secured so as to realize high picture quality.

10 Claims, 1 Drawing Sheet

HIGH RESOLUTION ORGANIC LIGHT EMITTING DISPLAY WITH INCREASED APERTURE RATIO

CLAIM OF PRIORITY

This application makes reference to, incorporates the same herein, and claims all benefits accruing under 35 U.S.C. §119 from an application earlier filed in the Korean Intellectual Property Office on Jun. 1, 2010 and there duly assigned Serial No. 10-2010-0051678.

BACKGROUND OF THE INVENTION

1. Field of the Invention

The present invention relates to an organic light emitting display and, more particularly, to an organic light emitting display in an active matrix.

2. Description of the Related Art

An organic light emitting display includes organic light emitting diodes, each having an anode electrode, an organic light emitting layer, and a cathode electrode. The organic light emitting display is divided into a passive matrix organic light emitting display in which organic light emitting diodes are coupled between scan lines and data lines in a matrix to form pixels, and an active matrix organic light emitting diode in which the operations of pixels are controlled by thin film transistors (TFTs) that function as switches. In general, the active matrix organic light emitting display includes TFTs for transmitting signals and capacitors for maintaining signals.

Since organic light emitting displays may be manufactured to be light and thin, the applications of the organic light emitting displays to portable displays increase. Recently, in accordance with the requests of users, the resolutions of the organic light emitting displays have increased and the sizes of the organic light emitting displays have been reduced.

When the resolution increases, due to reduction in the size of the pixels, the size of a light emitting region which transmits light (that is, an aperture ratio) is reduced. Due to reduction in brightness caused by reduction in the aperture ratio, picture quality deteriorates.

Furthermore, as a method of reducing manufacturing cost, research on reducing the number of masks has been continuously performed. Since the TFTs and the capacitors do not overlap in order to minimize the number of masks, the size of the pixels is limited. In addition, due to reduction in the size of the capacitors in accordance with reduction in the size of the pixels, it is difficult to secure the necessary capacitance.

SUMMARY OF THE INVENTION

Accordingly, the present invention has been developed in order to provide an organic light emitting display capable of increasing the size of a light emitting region (aperture ratio).

The present invention has also been developed in order to provide an organic light emitting display capable of increasing the electrostatic capacity of a capacitor.

In order to achieve the foregoing and/or other aspects of the present invention, according to a first aspect of the present invention, an organic light emitting display comprises: a substrate; a conductive layer formed on the substrate; a first insulating layer formed on the substrate, including the conductive layer; a first electrode layer and an activation layer formed on the first insulating layer by a semiconductor; a second insulating layer formed on the first insulating layer, including the first electrode layer and the activation layer; a gate electrode formed on the second insulating layer formed on the activation layer; a third insulating layer formed on the second insulating layer, including the gate electrode; a second electrode layer formed on the third insulating layer, and coupled to the activation layer and the conductive layer of a source region; and a third electrode layer formed on the third insulating layer, and coupled to the activation layer of a drain region.

According to a second aspect of the present invention, an organic light emitting display comprises: a substrate; a conductive layer formed on the substrate; a first insulating layer formed on the substrate, including the conductive layer; an activation layer formed on the first insulating layer by a semiconductor; a second insulating layer formed on the first insulating layer, including the activation layer; a gate electrode formed on the second insulating layer formed on the activation layer; a first electrode layer formed on the second insulating layer so as to be separated from the gate electrode; a third insulating layer formed on the second insulating layer, including the gate electrode, and on the first electrode layer; a second electrode layer formed on the third insulating layer, and coupled to the activation layer and the conductive layer of a source region; and a third electrode layer formed on the third insulating layer, and coupled to the activation layer of a drain region.

In the organic light emitting display according to the present invention, a conductive layer functioning as a wiring line for supplying a power source is formed on the bottom surface of a substrate. Therefore, the aperture ratio of the pixel may be easily secured and the problem of IR drop may be easily solved by controlling the area and thickness of the conductive layer.

In addition, according to the present invention, the conductive layer independently formed on the substrate is used as the electrode of the capacitor. Therefore, desired electrostatic capacity may be easily secured. In particular, in the case of a front surface light emitting structure, since a capacitor having a metal/insulating layer/metal (MIM) structure may be formed in a light emitting region, it is possible to secure enough aperture ratio and electrostatic capacity.

According to the present invention, a high resolution organic light emitting display may be easily realized, and enough aperture ratio and electrostatic capacity may be secured to realize high picture quality.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
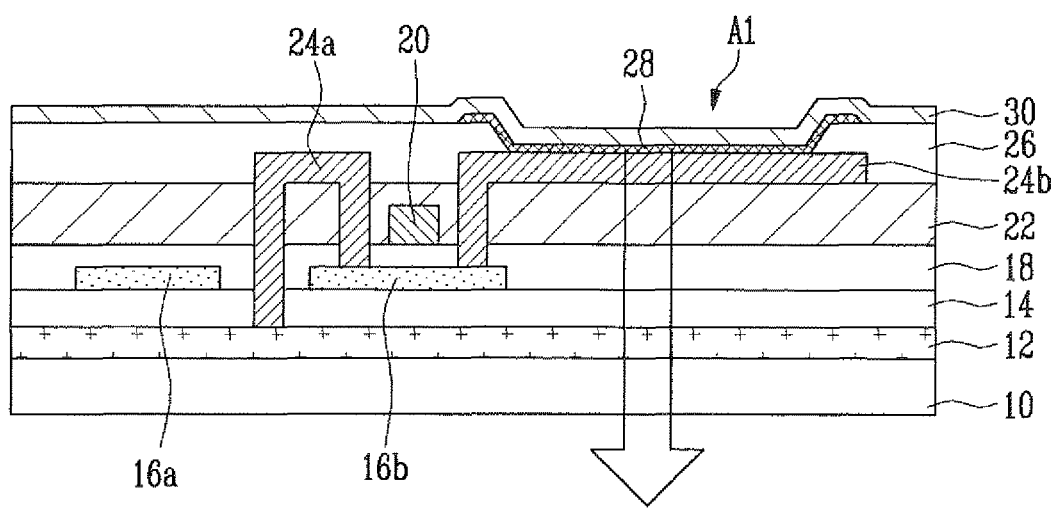
FIG. 1 is a sectional view illustrating an organic light emitting display having a back surface light emitting structure according to a first embodiment of the present invention.

In the following detailed description, only certain exemplary embodiments of the present invention have been shown and described, simply by way of illustration. As those skilled in the art will realize, the described embodiments may be modified in various different ways, all without departing from the spirit or scope of the present invention. Accordingly, the drawings and description are to be regarded as illustrative in nature and not restrictive. In addition, when an element is referred to as being "on" another element, it can be directly on the element or be indirectly on the element with one or more intervening elements interposed therebetween. Also, when an element is referred to as being "connected to" another element, it can be directly connected to the element or be indirectly connected to the element with one or more intervening elements interposed therebetween. Hereinafter, like reference numerals refer to like elements.

The following embodiments are provided to fully convey the concept of the invention to those skilled in the art, may be embodied in many different forms, and should not be construed as being limited to the embodiments set forth herein.

FIG. 1 is a sectional view illustrating an organic light emitting display having a back surface light emitting structure according to a first embodiment of the present invention.

Referring to FIG. 1, a conductive layer 12 is formed on a substrate 10. The substrate 10 is formed of an insulating material, such as transparent glass or plastic, and the conductive layer 12 is formed of a conductive material having high thermal resistance and permeability, such as indium tin oxide (ITO) and indium zinc oxide (IZO). The conductive layer 12 is used as a wiring line for supplying a power source, and as the electrode of a capacitor, and may be patterned on the substrate 10 in the form of a wiring line, or may be formed in a uniform region, such as a pixel region, in the form of a plate.

A first insulating layer 14 is formed on the substrate 10, including the conductive layer 12, and a first electrode layer 16a and an activation layer 16b are formed on the first insulating layer 14. The first insulating layer 14 is formed of an inorganic material, such as a silicon dioxide layer ($SiO_2$) or a silicon nitride layer (SiN), and is preferably formed to a thickness of 1000 Å to 5000 Å. The first electrode layer 16a and the activation layer 16b, as a semiconductor, are formed of amorphous silicon or poly-silicon. Amorphous silicon is crystallized by laser after being deposited. The first electrode layer 16a is doped with ions so as to be used as the electrode of the capacitor. The activation layer 16b is doped with ions so as to provide the channel region, the source region and the drain region of a thin film transistor (TFT).

The first electrode layer 16a is one electrode of the capacitor. The conductive layer 12, which faces the first electrode layer 16a, is used as another electrode of the capacitor. That is, a capacitor consisting of the conductive layer 12, the first insulating layer 14, and the first electrode layer 16a is formed.

A second insulating layer 18 is formed on the first insulating layer 14, including the first electrode layer 16a and the activation layer 16b. A gate electrode 20 is formed on the second insulating layer 18, which is formed on the activation layer 16b. The second insulating layer 18, used as a gate insulating layer, may be formed of a silicon dioxide layer ($SiO_2$), a silicon nitride layer (SiN), or a lamination structure of the silicon dioxide layer ($SiO_2$) and the silicon nitride layer (SiN). A gate electrode 20 is formed of a metal, such as Al, Mo, Cr, Ta, Ti, W, Cu, and Ag or doped poly-silicon.

A third insulating layer 22 is formed on the second insulating layer 18, including the gate electrode 20. A second electrode layer 24a and a third electrode layer 24b are formed on the third insulating layer 22. The second electrode layer 24a, used as a source electrode, is coupled to a source region of the activation layer 16b and to the conductive layer 12. The third electrode layer 24b, used as a drain electrode and an anode electrode, is coupled to a drain region of the activation layer 16b, and is extended to a light emitting region. For example, the second electrode layer 24a is coupled to the activation layer 16b through via holes formed in the second and third insulating layers 18 and 22, respectively, and is coupled to the conductive layer 12 through via holes formed in the first, second, and third insulating layers 14, 18, and 22, respectively. The third electrode layer 24b is coupled to the activation layer 16b through the via holes formed in the second and third insulating layers 18 and 22, respectively. The second electrode layer 24a and the third electrode layer 24b are formed of a conductive material having permeability, such as ITO and IZO.

A pixel defining layer 26 is formed on the third insulating layer 22, including the second electrode layer 24a and the third electrode layer 24b. An aperture Al is formed in the pixel defining layer 26 so that a part (a light emitting region) of the third electrode layer 24b, used as an anode electrode, is exposed. The pixel defining layer 26 may be selected from the group consisting of acryl resin, polyimide, polyamide, benzocyclobutane, and phenol resin as an organic system.

An organic light emitting layer 28 is formed on the third electrode layer 24b, which is exposed through the aperture Al, and a fourth electrode layer 30 is formed on the organic light emitting layer 28. The organic light emitting layer 28 may include an electron injecting layer, an electron transporting layer, a hole injecting layer, and a hole transporting layer. The fourth electrode layer 30, used as a cathode electrode, is formed of a metal.

In the above-described organic light emitting display, when a power source voltage VDD is supplied to the conductive layer 12, and a signal is input to the gate electrode 20 of a TFT, a predetermined voltage difference is generated between the third electrode layer 24b, used as an anode electrode, and the fourth electrode layer 30, used as a cathode electrode. At this point, holes injected through the anode electrode and electrons injected through the cathode electrode are re-combined in the organic light emitting layer 28. Light is emitted by an energy difference generated in this process. The emitted light travels to the outside through the substrate 10.

Figure 2:
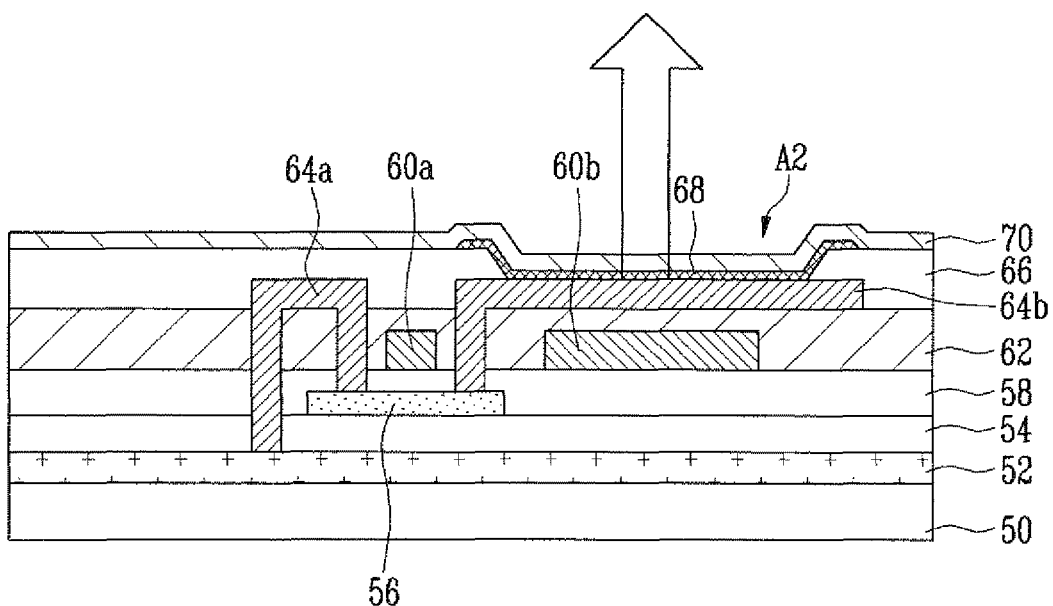
FIG. 2 is a sectional view illustrating an organic light emitting display having a front surface light emitting structure according to a second embodiment of the present invention.

FIG. 2 is a sectional view illustrating an organic light emitting display having a front surface light emitting structure according to a second embodiment of the present invention.

Referring to FIG. 2, a conductive layer 52 is formed on a substrate 50. The substrate 50 is formed of an insulating material, such as transparent glass or plastic. The conductive layer 52 is formed of a conductive material having high thermal resistance and permeability such as ITO and IZO. The conductive layer 52 is used as the wiring line for supplying a power source, and as the electrode layer of a capacitor. The conductive layer 52 may be patterned on the substrate 50 in the form of a wiring line, or it may be formed in a uniform region such as a pixel region in the form of a plate.

A first insulating layer 54 is formed on the substrate 50, including the conductive layer 52. An activation layer 56 is formed on the first insulating layer 54. The first insulating layer 54 is formed of the inorganic material, such as the silicon dioxide layer ($SiO_2$) or the silicon nitride layer (SiN), and is preferably formed to a thickness of 1000 Å to 5000 Å. The activation layer 56, as a semiconductor, is formed of amorphous silicon or poly-silicon. Amorphous silicon is crystallized by laser after being deposited. The activation layer 56 is doped with ions so as to provide the channel region, the source region and the drain region of a TFT.

A second insulating layer 58 is formed on the first insulating layer 54, including the activation layer 56. The second insulating layer 58 used as a gate insulating layer, may be formed of a silicon dioxide layer ($SiO_2$), a silicon nitride layer (SiN), or a lamination structure of the silicon dioxide layer (SiO$_2$) and the silicon nitride layer (SiN).

A gate electrode 60a is formed on the second insulating layer 58, which is formed on the activation layer 56. A first electrode layer 60b is formed on the second insulating layer 58, and is separated from the gate electrode 60a by a predetermined distance. The gate electrode 60a and the first electrode layer 60b are formed of a metal, such as Al, Mo, Cr, Ta, Ti, W, Cu, and Ag or a doped poly-silicon.

The first electrode layer 60a is the electrode of a capacitor. The conductive layer 52, which faces the first electrode layer 60a, is used as another electrode of a capacitor. That is, a capacitor consisting of the conductive layer 52, the first and second insulating layers 54 and 58, respectively, and the first electrode layer 60b is formed.

A third insulating layer 62 is formed on the second insulating layer 58, including the gate electrode 60a and the first electrode layer 60b. A second electrode layer 64a and a third electrode layer 64b are formed on the third insulating layer 62. The second electrode layer 64a, used as a source electrode, is coupled to a source region of the activation layer 56 and to the conductive layer 52. The third electrode layer 64b, used as a drain electrode and an anode electrode, is coupled to a drain region of the activation layer 56, and is extended to a light emitting region. For example, the second electrode layer 64a is coupled to the activation layer 56 through via holes formed in the second and third insulating layers 58 and 62, respectively, and is coupled to the conductive layer 52 through via holes formed in the first, second, and third insulating layers 54, 58 and 62, respectively. The third electrode layer 64b is coupled to the activation layer 56 through the via holes formed in the second and third insulating layers 58 and 62, respectively. The second electrode layer 64a and the third electrode layer 64b are formed of a metal or a conductive material having high permeability, such as ITO and IZO.

A pixel defining layer 66 is formed on the third insulating layer 62, including the second electrode layer 64a and the third electrode layer 64b. An aperture A2 is formed in the pixel defining layer 66 so that a part (a light emitting region) of the third electrode layer 64b, used as an anode electrode, is exposed. The pixel defining layer 66 may be selected from the group consisting of acryl resin, polyimide, polyamide, benzocyclobutane, and phenol resin as an organic system.

An organic light emitting layer 68 is formed on the third electrode layer 64b, which is exposed through the aperture A2. A fourth electrode layer 70 is formed on the organic light emitting layer 68. The organic light emitting layer 68 may include an electron injecting layer, an electron transporting layer, a hole injecting layer, and a hole transporting layer. The fourth electrode layer 70, used as a cathode electrode, is formed of a conductive material having high permeability, such as ITO and IZO.

In the organic light emitting display having the above structure, when a power source voltage VDD is supplied to the conductive layer 52, and a signal is input to the gate electrode 60a of a TFT, a predetermined voltage difference is generated between the third electrode layer 64b, used as an anode electrode, and the fourth electrode layer 70, used as a cathode electrode. At this point, holes injected through the anode electrode and electrons injected through the cathode electrode are re-combined with each other in the organic light emitting layer 68. Light is emitted by an energy difference generated in this process. The emitted light travels to the outside through the fourth electrode layer 70.

The organic light emitting display according to the present invention receives the power source voltage VDD through the conductive layers 12 and 52, which are independently formed on the substrates 10 and 50, respectively. When a wiring line for supplying a power source is formed in the processes of forming the gate electrode or the source and drain electrodes of a TFT, the size of a light emitting region (that is, an aperture ratio) is reduced by the area occupied by the wiring line. In addition, since the area occupied by the wiring line is limited, it is not easy to solve the problem of IR drops. However, according to the present invention, the conductive layers 12 and 52, as wiring lines for supplying a power source, are formed on the bottom surfaces of the substrates 10 and 50, respectively, that is, parts adjacent to the surfaces of the substrates 10 and 50, respectively. Therefore, it is possible to easily secure the aperture ratio, and to easily solve the problem of IR drops, by controlling the area or thickness of the conductive layers 12 and 52, respectively.

In addition, according to the present invention, the conductive layers 12 and 52 independently formed on the substrates 10 and 50, respectively, are used as the electrodes of a capacitor. When the two electrodes of a capacitor are formed in the processes of forming the activation layer, the gate electrode, and the source and drain electrodes of a TFT, it is difficult to secure enough desired electrostatic capacity from a limited area. However, according to the present invention, since the conductive layers 12 and 52 formed on the bottom surfaces of the substrates 10 and 50, respectively, are used as the electrodes of the capacitor, it is possible to easily secure the desired electrostatic capacity. In particular, in the case of the front surface light emitting structure (refer to FIG. 2), since the capacitor of the metal/insulating layer/metal (MIM) structure may be formed in the light emitting region, it is possible to secure enough aperture ratio and electrostatic capacity.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. An organic light emitting display, comprising;
    a substrate;
    conductive layer formed on the substrate;
    a first insulating layer formed on the substrate and on the conductive layer;
    a first electrode layer and an activation layer formed OR the first insulating layer as a semiconductor;
    a second insulating layer formed on the first insulating layer, the first electrode layer and the activation layer;
    a gate electrode formed on the second insulating, layer which is formed on the activation layer;
    a third insulating layer formed on the second insulating layer and on the gate electrode;
    a second electrode layer formed on the third insulating layer, and coupled to a source region of the activation layer and to the conductive layer; and
    a third electrode layer formed on the third insulating layer, and coupled to a drain region of the activation layer;
    wherein the first electrode layer is used as one electrode of a capacitor, and wherein the conductive layer facing the first electrode layer is used as another electrode of the capacitor.

2. The organic light emitting display as claimed in claim 1 wherein the conductive layer is formed of a transparent material.

3. The organic light emitting display as claimed in claim 1, wherein the conductive layer is used as a wiring line for supplying a power source.

4. The organic light emitting display as claimed in claim 1, wherein the first insulating layer is formed of an inorganic material.

5. The organic light emitting display as claimed in claim 4, wherein the first insulating layer is formed to a thickness in a range of 1000 Å to 5000 Å.

6. The organic light emitting display as claimed in claim 1, wherein the third electrode layer is coupled to the activation layer through via holes formed in the second and third insulating layers.

7. An organic light emitting display, comprising:
a substrate;
a conductive layer formed on the substrate;
a first insulating layer formed on the substrate and on the conductive layer;
a first electrode layer and an activation layer formed on the first insulating layer as a semiconductor;
a second insulating layer formed on the first insulating layer, the first electrode layer and the activation layer;
a gate electrode formed on the second insulating layer which is formed on the activation layer;
a third insulating layer formed on the second insulating layer and on the gate Electrode;
a second electrode layer formed on the third insulating layer, and coupled to a source region of the activation layer and to the conductive layer; and
a third electrode layer formed on the third insulating layer, and coupled to a drain region of the activation layer;
wherein the second electrode layer is coupled to the activation layer through via holes formed in the second and third insulating layers, and is coupled to the conductive layer through via holes formed in the first, second, and third insulating layers.

8. An organic light emitting display, comprising:
a substrate;
a conductive layer formed on the substrate;
a first insulating layer formed on the substrate and on the conductive layer,
a first electrode layer and an activation layer formed on the first insulating layer as a semiconductor;
a second insulating layer formed on the first insulating layer, the first electrode layer and the activation layer;
a gate electrode formed on the second insulating layer which is formed on the activation layer;
a third insulating layer formed on the second insulating layer and on the gate electrode;
a second electrode layer formed on the third insulating layer, and coupled to a source region of the activation layer and to the conductive layer;
a third electrode layer formed on the third insulating layer, and coupled to a drain region of the activation layer; and
a pixel defining layer formed on the third insulating layer, the second electrode layer and the third electrode layer, and having an aperture so that a part of the third electrode layer is exposed.

9. The organic light emitting display as claimed in claim 8, further comprising an organic light emitting layer formed on the third electrode layer which is exposed through the aperture.

10. The organic light emitting display as claimed in claim 9, further comprising a fourth electrode layer formed the organic light emitting layer.

* * * * *